(12) United States Patent
Lee et al.

(10) Patent No.: US 7,368,822 B2
(45) Date of Patent: May 6, 2008

(54) COPPER METALIZED OHMIC CONTACT ELECTRODE OF COMPOUND DEVICE

(75) Inventors: Cheng-Shih Lee, Gueishan Township, Taoyuan County (TW); Edward Yi Chang, Hsinchu (TW); Ke-Shian Chen, Taoyuan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/377,302

(22) Filed: Mar. 17, 2006

(65) Prior Publication Data

US 2007/0158844 A1 Jul. 12, 2007

(30) Foreign Application Priority Data

Jan. 3, 2006 (TW) .............................. 95100136 A

(51) Int. Cl.
*H01L 23/48* (2006.01)
(52) U.S. Cl. ............ 257/742; 257/624; 257/743; 257/744; 257/E29.143; 257/E21.046; 257/E21.062
(58) Field of Classification Search ............... 257/742, 257/E29.143, 624, 743, 744, E21.046, E21.062
See application file for complete search history.

(56) References Cited

U.S. PATENT DOCUMENTS

| 3,965,279 A | 6/1976 | Levinstein et al. ............ 427/89 |
| 4,011,583 A | 3/1977 | Levinstein et al. ........... 357/67 |
| 6,552,371 B2 * | 4/2003 | Levine et al. ................ 257/110 |
| 6,573,599 B1 * | 6/2003 | Burton et al. ................ 257/745 |
| 2004/0113216 A1 * | 6/2004 | Liu et al. ..................... 257/414 |
| 2004/0224473 A1 * | 11/2004 | Chua et al. .................. 438/313 |
| 2006/0292785 A1 * | 12/2006 | Chang et al. ................ 438/202 |

* cited by examiner

*Primary Examiner*—Eugene Lee
*Assistant Examiner*—Mohammad Timor Karimy
(74) *Attorney, Agent, or Firm*—Troxell Law Office, PLLC

(57) ABSTRACT

The present invention provides an ohmic contact for a copper metallization whose heat diffusion is improved and cost is reduced. Therein, the ohmic contact is formed through a depositing and an annealing of three metal layers of Pd, Ge and Cu; and, the contact resistance of the ohmic contact is adjusted by the thicknesses of the three layers.

8 Claims, 1 Drawing Sheet

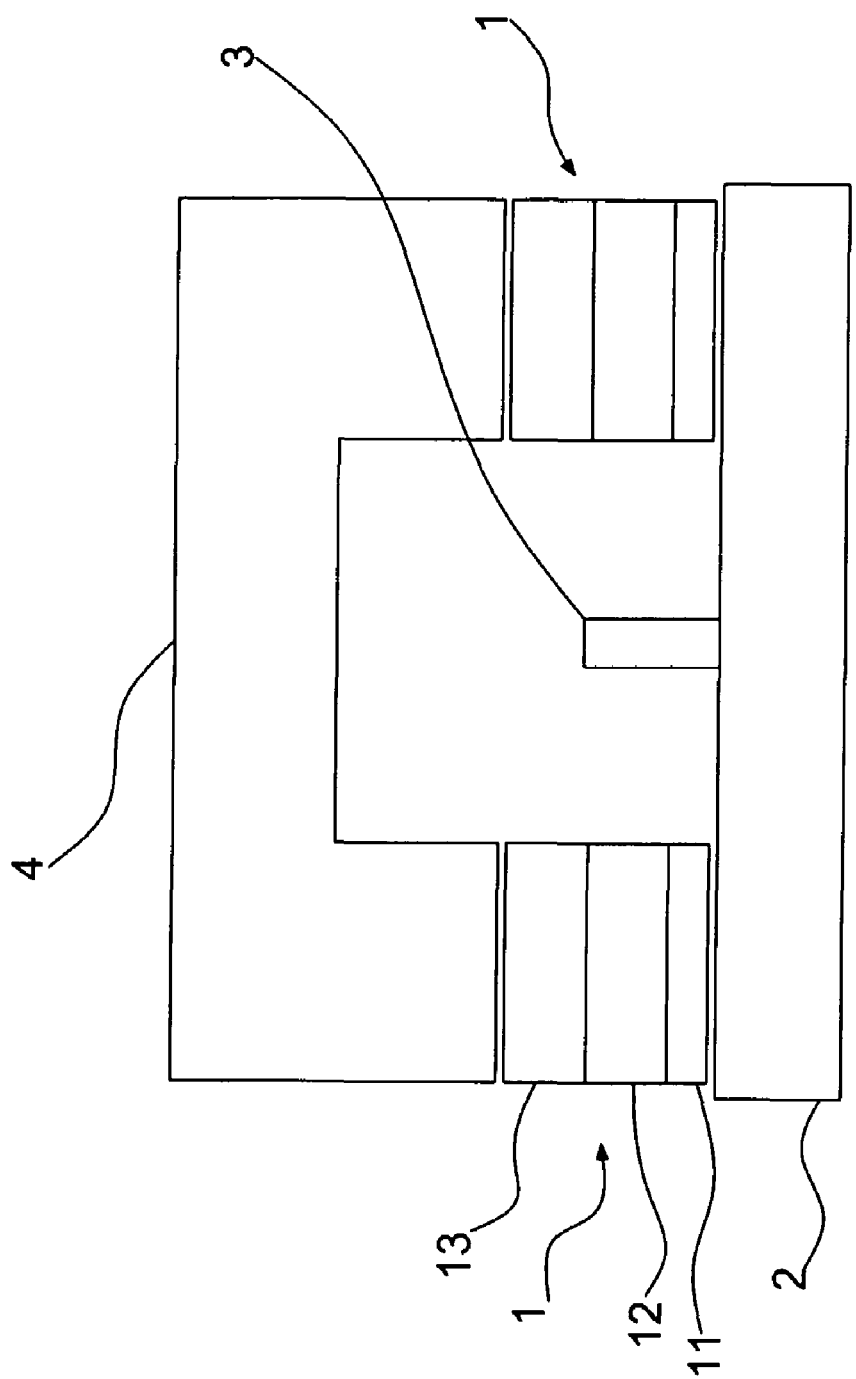

COPPER METALIZED OHMIC CONTACT ELECTRODE OF COMPOUND DEVICE

FIELD OF THE INVENTION

The present invention relates to a compound diode; more particularly, relates to obtaining an ohmic contact electrode having a low contact resistance by adjusting thicknesses of a palladium (Pd) layer, a germanium (Ge) layer and a copper (Cu) layer coordinated with an annealing process under a proper temperature, where the ohmic contact electrode is applied in a Cu metallization; and the contact resistance of a compound semiconductor device in the ohmic contact electrode is effectively improved and the cost is effectively reduced as well.

DESCRIPTION OF THE RELATED ARTS

Traditionally, the ohmic metals used by gallium arsenide (GaAs) devices are divided into two groups: one is a group of alloyed gold (Au)/germanium(Ge)/nickel(Ni); and the other is a group of Pd/Ge/Au through solid phase reactions. The group of Au/Ge/Ni is the most widely used ohmic contact now, which is obtained mainly through an eutectic reaction between Au and Ge and a diffusion of Ge. Because the eutectic melting point for Ge/Au is 360 Celsius degrees (° C.), its disadvantage is that, under such a high temperature, the ohmic metal for the contact resistance is diffused into the substrate. In addition, under an environment of a potential difference, a degradation of the contact resistance happens either.

Regarding the other group of Pd/Ge/Au, a solid phase reaction occurs in a rapid thermal annealing (RTA) process, where a better stability under high temperature is obtained; yet a higher contact resistance than the group of Au/Ge/Ni is obtained either as a disadvantage. Its ohmic contact is formed through firstly obtaining a ternary phase of palladium gallium arsenide (PdGaAs) on a GaAs layer; then the ternary phase is decomposed into a Pd/Ge phase; and then a n+ GaAs (Ge) is obtained by a re-growth on a surface of the GaAs. Thus, an observation is obtained that the ternary phase of PdGaAs has a quite strong impact on the ohmic contact. Hence, if the metal for the ohmic contact is Cu metalized, it is of great help to the whole procedure for the ohmic contact. Yet no proper Cu-metalized ohmic contact for the ohmic contact appears until now.

An U.S. Pat. No. 3,965,279, "Ohmic contact for group III-V n-type semiconductors", is proclaimed. An object of two metals of PdGe is formed on a n– GaAs through an electron beam evaporated depositing (EBE depositing); and then an ohmic contact is obtained through an RTA. This is a traditional way to obtain an ohmic contact.

Another U.S. Pat. No. 4,011,583, "Ohmic contacts of germanium and palladium alloy from group III-V n type semiconductors" is proclaimed. Another object of two metals of PdGe is formed on another n– GaAs through an e-beam depositing; and then another ohmic contact is obtained through an RTA under 300 to 500° C., where a diffusion for Pd/Ge is obtained under the temperature between 300 and 500° C. without melting. Yet the temperature is so high that it is not applied to the GaAs device.

Besides the above patents, a first article is published, "Microstructure characterization of Cu3Ge/n-type GaAs ohmic contacts", by M. O. Aboelfotoh, J. Appl. Phys., 76(10), 1994. Therein, a first ohmic contact is obtained with an object of two metals of GeCu, whose contact resistance is about $6.5 \times 10^{-7}$ square centimeters ($cm^2$). When the concentration of Ge is between 5 and 40 percent (%), an ohmic contact is obtained. In addition, when the concentration of Ge is over 25%, a phase of GeCu compound having low contact resistance together with Ge is obtained at the same time. This kind of GeCu is the only Cu-metalized ohmic contact over GaAs device till now. An ohmic characteristic is obtained by the reaction between Ge and Cu, whose contact resistance is about $6.5 \times 10^{-7}$ $cm^2$. When the concentration of Ge is between 5 and 40%, an ohmic contact is obtained. Moreover, when the concentration of Ge is over 25%, a phase of Cu3Ge compound having low contact resistance together with Ge is obtained. Because the Cu and the Cu compound are directly contacted with the surface of the GaAs device, Cu is apt to be diffused into the lattice of GaAs.

A second article is published, "On the low resistance Au/Ge/Pd ohmic contact to n– GaAs", by P. H. Hao, J. Appl. Phys., 79(8), 1996. Therein, a second ohmic contact of Au/Ge/Pd is obtained on a n– GaAs; and then is processed with an annealing under a temperature below the eutectic temperature of Cu/Ge so that a low contact resistance of $\sim 10^{-6}$ $cm^2$ is obtained.

A third article is published, "Ohmic contact formation mechanism of the Au/Ge/Pd/n– GaAs system formed below 200° C.", by L. C. Wang, J. Appl. Phys., 79(8), 1996. Therein, an Au/Ge/Pd is obtained on a n– GaAs; and then is processed with an annealing under a temperature of 175° C. to obtain a low contact resistance of $\sim 10^{-6}$ $cm^2$. Under a lower temperature, the Pd reacts with the GaAs to obtain a phase of Pd4GaAs; and, under a higher temperature, the phase of Pd4GaAs is decomposed to obtain an n+ GaAs.

Although the above prior arts processes Cu metallization, a diffusion barrier layer is required for each prior art to avoid actions between Cu and Au. Hence, the prior arts do not fulfill users' requests on actual use.

SUMMARY OF THE INVENTION

The main purpose of the present invention is to obtain an ohmic contact electrode having a low contact resistance for compound devices, where the contact resistance of a GaAs is improved and the cost is effectively reduced at the same time.

To achieve the above purpose, the present invention is a Cu-metalized compound device using an ohmic contact electrode, where the ohmic contact electrode is composed of a Pd layer, a Ge layer and a Cu layer, deposited on a compound semiconductor device through E-beam deposition; then superfluous metal and photo resist are removed; and finally the ohmic contact electrode having a low contact resistance is obtained through an RTA. Therein, the ohmic contact electrode having a low contact resistance is obtained through the RTA under a proper temperature and the adjustment of thicknesses of the Pd layer, the Ge layer and the Cu layer; and a Cu-metalized compound semiconductor device is obtained by using an ohmic contact without depositing any barrier layer on the ohmic contact electrode. Accordingly, a novel Cu-metalized compound device using an ohmic contact electrode is obtained.

BRIEF DESCRIPTIONS OF THE DRAWING

The present invention will be better understood from the following detailed description of the preferred embodiment according to the present invention, taken in conjunction with the accompanying drawing, in which FIG. 1 is a view showing a structure of a preferred embodiment according to the present invention.

DESCRIPTION OF THE PREFERRED EMBODIMENT

The following description of the preferred embodiment is provided to understand the features and the structures of the present invention.

Please refer to FIG. 1, which is a view showing a structure of a preferred embodiment according to the present invention. As shown in the figure, the present invention is a copper-metalized compound diode device using an ohmic contact electrode, where the ohmic contact electrode 1 is composed of a palladium (Pd) layer 11, a germanium (Ge) layer 12 and a copper (Cu) layer 13; the layers (Pd/Ge/Cu) 11, 12, 13 are at first deposed on a compound semiconductor device 2; the compound semiconductor device 2 is a gallium arsenide (GaAs) device; then superfluous metal and photo resist are removed through a lift-off process; and, in the end, the layers 11, 12, 13 are processed through a rapid thermal annealing (RTA) to obtain the ohmic contact electrode. Therein, the ohmic contact electrode 1 obtains a low contact resistance through adjusting thicknesses of the layers 11, 12, 13 coordinated with the RTA under a proper temperature; the thickness of the Pd layer is between 50 and 1000 angstroms (Å); the thickness of the Ge layer is between 500 and 10000 Å; the thickness of the Cu layer is between 500 and 10000 Å; and a $9\times10^{-7}$ ohms square centimeter ($\Omega$ cm$^2$) of contact resistance for the ohmic contact electrode 1 is obtained under an annealing temperature of 250 Celsius degrees (° C.). In addition, the compound semiconductor device 2 is a heterojuncton bipolar transistor (HBT), a high electronic mobility transistor (HEMT) or a metal semiconductor field effect transistor (MESFET).

When processing a Cu metallization with the ohmic contact electrode, a Schottky metal 3 is deposed on a compound semiconductor device 2 through an electron beam evaporated depositing (EBE depositing) coordinated with an air bridge of Cu 4, where an end of the air bridge is connected with the ohmic contact electrode 1 without depositing a diffusion barrier layer. And, an ohmic contact is obtained by an inter-reaction among the metals of Pd, Ge and Cu and by a diffusion of Ge to the compound semiconductor device 2; thus, a compound semiconductor device completely Cu-metalized is obtained. In the present invention, the ohmic contact 1, the Schottky metal 3 and the air bridge of Cu 4 are all made of copper, where the Cu has better heat-transmission and electric conductivity than Au, a traditional material for those components; the heat diffusion of the compound semiconductor device is thus effectively improved; and cost is also effectively reduced owing to less price of Cu than Au.

To sum up, the present invention is a Cu-metalized compound diode device using an ohmic contact electrode, where the ohmic contact electrode with a low contact resistance is obtained through adjusting thicknesses of three metal layers coordinated with an annealing under a proper temperature; no barrier layer is required; Cu components are used; a heat diffusion of a compound semiconductor device for the ohmic contact electrode is effectively improved; and the cost is effectively reduced too.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A copper metalized compound device comprising:
   a) a compound semiconductor device; and
   b) an ohmic contact electrode located on the compound semiconductor device and having:
      i) a palladium layer having a thickness between 50 angstroms and 1000 angstroms;
      ii) a germanium layer located directly on the palladium layer and having a thickness between 500 anastroms and 10000 angstroms; and
      iii) a copper layer located directly on the germanium layer and having a thickness between 500 angstroms and 10000 angstroms.

2. The copper metalized compound device according to claim 1, wherein the palladium layer, the germanium layer, and the copper layer are formed by a process selected from a group consisting of electron beam evaporation, thermal evaporation, and sputter deposition.

3. The copper metalized compound device according to claim 2, wherein the palladium layer, the germanium layer, and the copper layer are annealed forming the ohmic contact layer.

4. The copper metalized compound device according to claim 1, wherein the ohmic contact electrode has a contact resistance formed by annealing the palladium layer, the germanium layer, and the copper layer.

5. The copper metalized compound device according to claim 4, wherein the contact resistance of the ohmic contact electrode is adjusted by changing thicknesses of the palladium layer, the germanium layer, and the copper layer.

6. The copper metalized compound device according to claim 1, wherein the compound semiconductor device is selected form a group consisting of a heterojunction bipolar transistor (HBT), a high electron mobility transistor (HEMT), and a metal semiconductor field effect transistor (MESFET).

7. The copper metalized compound device according to claim 1, wherein the compound semiconductor device is a gallium arsenide (GaAs) device.

8. The copper metalized compound device according to claim 1, further comprising a copper air bridge located on the copper layer.

* * * * *